United States Patent
Wei

(10) Patent No.: US 6,708,754 B2
(45) Date of Patent: Mar. 23, 2004

(54) FLEXIBLE HEAT PIPE

(76) Inventor: Wen-Chen Wei, P.O. Box No. 6-57, Chung-Ho, Taipei 235 (TW)

(*) Notice: Subject to any disclaimer, the term of this patent is extended or adjusted under 35 U.S.C. 154(b) by 57 days.

(21) Appl. No.: 10/024,230

(22) Filed: Dec. 21, 2001

(65) Prior Publication Data

US 2003/0019607 A1 Jan. 30, 2003

(30) Foreign Application Priority Data

Jul. 25, 2001 (TW) ...................................... 90212592 U

(51) Int. Cl.[7] .................................................. F28F 7/00
(52) U.S. Cl. .................... 165/46; 165/104.33; 165/80.3; 361/687; 361/700; 257/715
(58) Field of Search .............................. 165/46, 104.21, 165/104.26, 104.33, 185; 361/700, 699, 687; 257/714, 715, 722; 174/15.2, 16.3

(56) References Cited

U.S. PATENT DOCUMENTS

| | | | |
|---|---|---|---|
| 5,646,822 A | * | 7/1997 | Bhatia et al. .......... 165/104.33 |
| 5,647,429 A | * | 7/1997 | Oktay et al. ........... 165/104.33 |
| 5,796,581 A | * | 8/1998 | Mok ...................... 165/104.33 |
| 5,847,925 A | * | 12/1998 | Progl et al. ............ 165/104.33 |
| 5,946,191 A | * | 8/1999 | Oyamada ............... 165/104.33 |
| 6,026,888 A | * | 2/2000 | Moore .................... 165/104.33 |
| 6,070,654 A | * | 6/2000 | Ito ......................... 165/104.33 |
| 6,250,378 B1 | * | 6/2001 | Kobayashi ............. 165/104.33 |
| 6,253,836 B1 | * | 7/2001 | Mitchell ................ 165/104.33 |
| 6,276,448 B1 | * | 8/2001 | Maruno ................. 165/104.33 |
| 6,343,643 B1 | * | 2/2002 | Bollesen ................ 165/104.33 |

* cited by examiner

Primary Examiner—Christopher Atkinson
(74) Attorney, Agent, or Firm—Troxell Law Office PLLC

(57) ABSTRACT

A flexible heat pipe mainly has a heat pipe disposed between an electronic heat generating component and a heat sink; the middle segment of the said heat pipe is a flexible hose with a capillary structure disposed on the inner tube wall and connects with metal tubes at two ends by means of lashing rings; a flexible heat pipe formed accordingly can be adjusted toward any direction, placed over various parts inside a computer and respectively assembled to the electronic heat generating component as well as the heat sink which is to be mounted in any proper and ventilating area for evenly and rapidly diffusing the heat so as to achieve the effect of space utilization and best heat dissipation.

4 Claims, 4 Drawing Sheets

FLEXIBLE HEAT PIPE

BACKGROUND OF THE INVENTION

1) Field of the Invention

The present invention relates to a flexible heat pipe, more specifically, a structure has a flexible heat pipe disposed between a heat source and a heat sink for conducting the heat and allowing the heat dissipation device to be placed in any proper and ventilating area for rapidly dissipating the heat and efficiently lowering the temperature.

2) Description of the Prior Art

Accordingly, in order to solve the overheat problem of a computer component, usually a heat sink device is additionally installed thereon to outwardly diffuse the generated heat through the heat sink device. A conventional heat sink device comprises a fan and a heat sink, wherein the fan is fixedly screwed to the heat sink and the base plate of the heat sink presses the electronic component, thereby the high temperature generated during the operation of the electronic component can be dissipated since the fan conducts the air inwardly and the heat sink conducts the heat outwardly. This kind of hear sink device does have the efficiency of heat dissipation; however, since the base plate of the heat sink has to directly press the electronic component and the absorbed heat to be diffused by the heat sink forms hot air blowing to and fro inside the compute, the effect of heat dissipation is not desirable; furthermore, the fan makes noises in operation and that bothers the user a lot. Therefore, another manufacturer offered an improved heat sink of a heat-pipe style which has a heat pipe disposed between the heat sinks or on the bottom portion of the heat sinks; the principle of the heat sink is to dispose a metal pipe with working fluid to conduct both air and fluid heat transferring and with a capillary structure having a metal mesh for capillary action; under low temperature and low pressure, the air and fluid in the heat pipe is balanced; when one end absorbs the heat, the working fluid closer to that end evaporates due to instant heat absorption; this rapid gasification raises the pressure, pushes the air to flow toward another end and also liberates the heat in liquefaction; the liquefied working fluid, through the capillary action of the capillary structure, flows back to the original heat-absorbing end for conducting another gasification in heat absorbing so as to achieve the effect of rapid heat transferring through cycling operation and the heat is evenly distributed to the heat sink to be diffused through the air; that means, the high heat conduction of the heat pipe conducts the absorption of the heat source and evenly distributes it to the heat sink to be further diffused by the air. The heat pipe structure is capable of solving the shortcomings of uneven heat conduction and noise generation, the heat sink of heat-pipe device does not require fan installation, however, the heat pipe must be directly inserted and pressed to the heat source and it is unable to be disposed around or overhead; the industrials often find it troublesome in locating the heat sink device; furthermore, the heat pipe is disposed with the heat sink in the same sealed computer case and has limited space to contact with the air, therefore the heat is unable to be rapidly diffused, none the less, that causes undesirable heat dissipation and fails to achieve an ideal effect of heat dissipation, lower the temperature of the heat source and is subject to burn and damage the parts as well as shorten the useful lives thereof.

In view of the shortcomings of the inefficiency of heat dissipation and the structural design of the conventional heat sink device, the inventor of the present invention, researched various methods to solve the problems, after continuous researches and improvements, finally culminated in a flexible heat pipe structure with rapid heat dissipation effect and the heat sink thereof can be disposed in any proper ventilating area.

SUMMARY OF THE INVENTION

Specifically, the present invention mainly has a heat pipe disposed between a heat source and a heat sink; the middle segment of the said heat pipe is a flexible hose made of various vacuum-pressed, air-pressed or oil-pressed high pressure pipes with a capillary structure disposed on the inner tube walls therein and connects with metal tubes at two ends by means of lashing rings; a flexible heat pipe formed accordingly can be adjusted toward any direction, placed over various parts inside a computer and respectively assembled to the heat source (the heating portion) as well as the heat sink (the cooling portion). For example, the heat pipe at the end connecting with the heat source CPU is a bent pipe in a horn shape with a narrow top and a wide bottom to define a heat pipe seat; the bottom portion is flat and extends outwardly from the circumference thereof to form a circular absorbing disc for facilitating the firm attachment between the heat pipe seat and the CPU; for conveniencing the assembling and fastening, a fastening rest is inserted and pressed on the heat absorbing disc for rotating the angle and adjusting the direction of the heat pipe; a retainer is further placed over the fastening rest and hooked with the hook block of the CPU foot stand to finish a fastened assembly; the cooling end of the heat pipe at the end connecting with the heat sink is designed either as an insert tube correspondingly to the shape of the heat sink to be inserted to an insert hole of the heat sink or as a flat shape to be attached to the bottom end of the heat sink; the said heat sink can be mounted in any proper and ventilating area, especially on the outer side of the case of the computer main set for directly contacting with the air to rapidly diffuse the heat and to end the situation of cumulating the heat on the electronic component so as to achieve the effect of space utilization, best heat dissipation and further maintain the useful life of the product.

Therefore, the primary objective of the present invention is to provide a flexible heat pipe structure by disposing a flexible hose to place the heat pipe structure over the parts inside the computer so as to mount the heat sink in any proper ventilating area not limited by the installation space but for achieving the best efficiency of heat dissipation.

Another objective of the present invention is to provide a flexible heat pipe structure by disposing the heat sink on the outer portion of the machine case for directly contacting with the air so as to eliminate the situation of heat cumulation for achieving the efficiency of rapid heat dissipation and maintaining the useful life of the product.

Yet another objective of the present invention is to provide a flexible heat pipe structure by forming the bottom end of the heat pipe seat into a heat absorbing disc to be assembled to the heat source to allow the absorbed heat from the electronic component to be conducted rapidly to the heat sink so as to achieve the effect of a fast heat distribution.

To enable a further understanding of the other objectives, the structure and features of the present invention, the brief description of the drawings below is followed by the detailed description of the preferred embodiment.

DETAILED DESCRIPTION OF THE PREFERRED EMBODIMENTS

Figure 1:
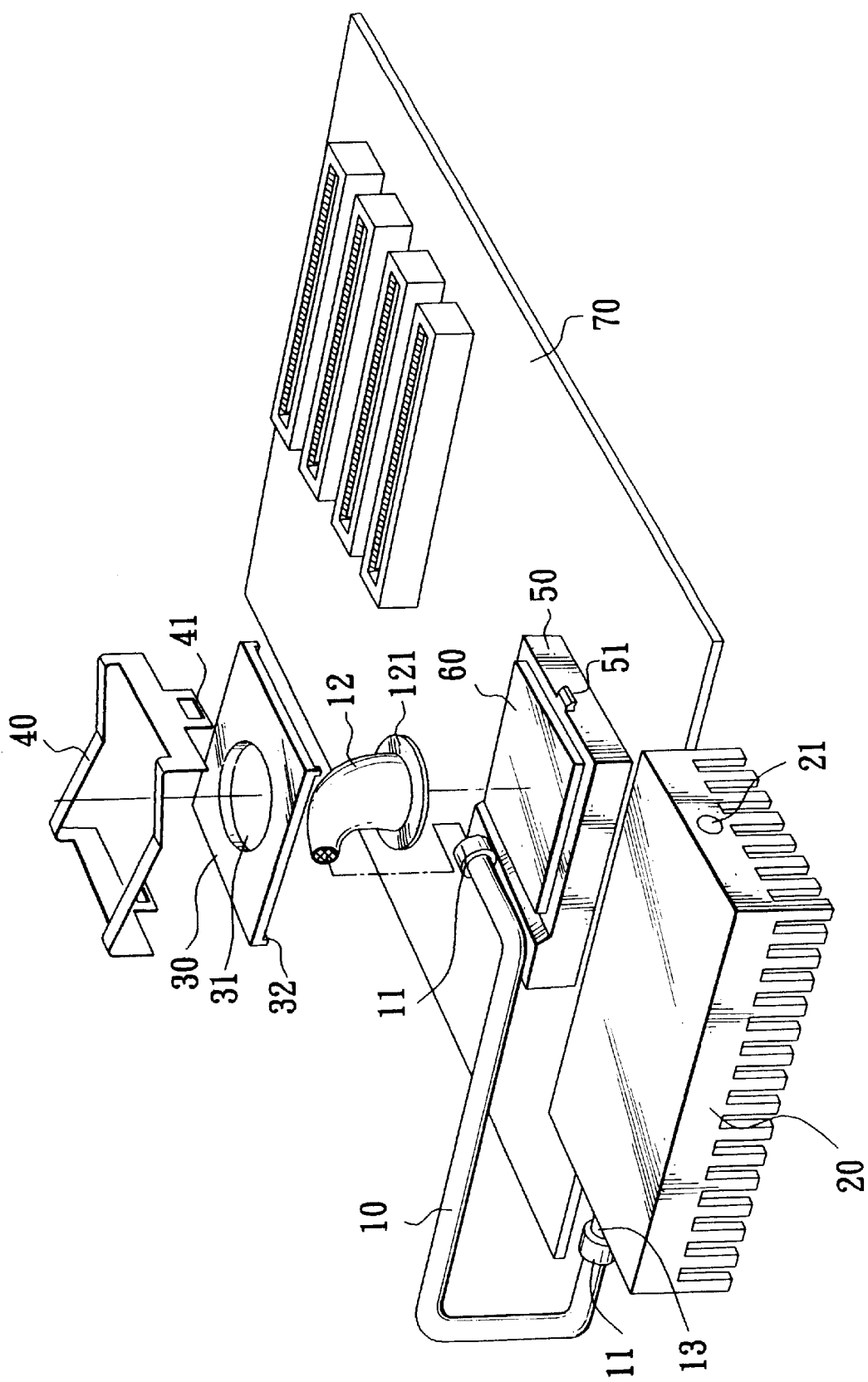
FIG. 1 is a schematic drawing of the present invention.
Figure 3:
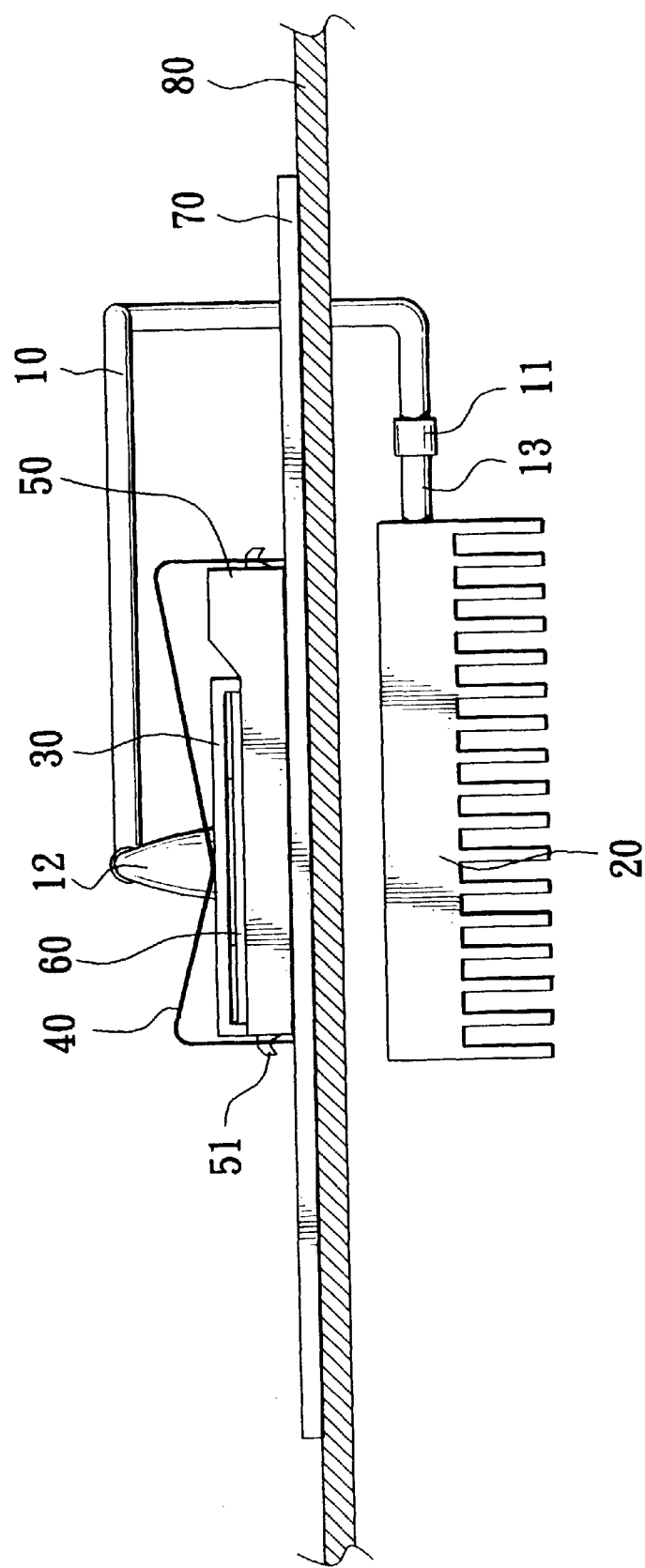
FIG. 3 is a schematic drawing of the application of the assembled present invention.

Referring to FIG. 1, the schematic drawing of the present invention, the present invention mainly comprises a heat pipe mechanism, a retaining mechanism, an electronic heat generating component (CPU) (60) and a heat sink (20), wherein the heat pipe mechanism comprises a flexible hose (10), a lashing ring (11), a heat pipe seat (12) and a heat pipe (13); the said flexible hose (10) is made of high pressure pipe with a capillary structure (not shown in the Figure) disposed on the inner tube wall thereof to evenly transfer mass heat; two ends of the flexible hose (10) respectively connect with a heat pipe seat (12) and a heat pipe (13) by means of lashing rings (11) to separat the heating portion and the cooling portion; the said heat pipe seat (12) is a metal tube in a horn shape with a narrow top and a wide bottom; the bottom portion thereof is flat and extends outwardly from the circumference thereof to form a circular absorbing disc (121) for facilitating the firm attachment between the heat pipe seat (12) and the heat generating component CPU (60); the heat pipe (13) is designed as an insert tube correspondingly to the shape of the heat sink (20) to be inserted to an insert hole (21) of the heat sink (20) for evenly conducting the heat on the heat pipe seat (12) and absorbed from the CPU (60) to the heat pipe (13) through the flexible hose (10), thereby the heat transferred to the heat pipe (13) is absorbed and diffused by the heat sink (20); the said heat sink (20) can be mounted in any proper and ventilating area, especially on the outer side of the case of the computer main set (as shown in FIG. 3) for directly contacting with the air; the airflow rapidly diffuses the heat and eliminates the situation of heat cumulation on the electronic component so as to achieve the effect of best heat dissipation.

The retaining mechanism comprises a fastening rest (30) and a retainer (40); the fastening rest (30) is a plate body with a hollow and circular insert hole (31) to be inserted onto the heat absorbing disc (121); claw feet (32) are disposed in the lower aspect of the four corner ends thereof to be reversely hooked to the CPU (60) for facilitating heat pipe seat (12) to the rotate its angle and adjust its direction; the said retainer (40) is placed over the fastening rest (30); two opposite sides of the lower ends thereof are respectively disposed with a retaining hole (41) to be hooked with the hook blocks (51) of a CPU foot stand (50) so as to finishing and fasten an assembly; the fastening rest (30) is inserted onto the heat absorbing disc (121) but does not cover the whole heat absorbing disc (121), therefore, the angle of the heap pipe seat (12) can be rotated and its direction can be adjusted to keep away from the sensitive parts inside the computer and correspond to the orientation of the heat sink (20).

Figure 2:
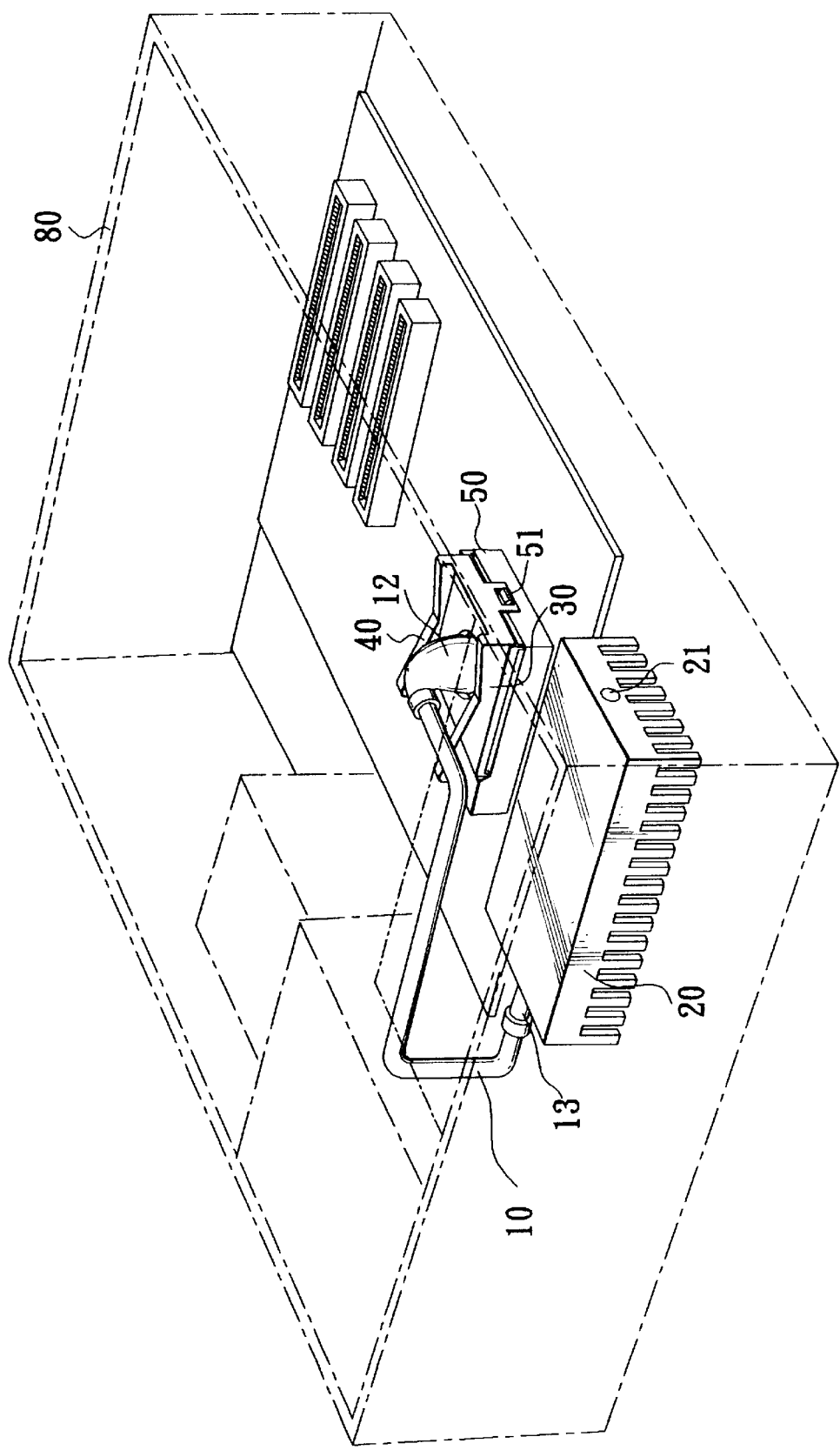
FIG. 2 is a pictorial and schematic drawing of the assembled present invention.

Referring to FIG. 2, the pictorial and schematic drawing of the assembled present invention, when in assembling, the flexible hose (10) connects with the heat sink (20) by going around or over to allow the heat sink (20) to be mounted in a proper and ventilating area outside the mother board without bumping and damaging the sensitive parts inside the computer; when the working fluid closer to that end evaporates due to heat absorption, the hot air is conducted to the heat pipe (13) through the flexible hose (10); the heat in the heat pipe (13) rapidly diffuses due to the absorption of the heat sink (20) and the air in the heat piper (13) also liberates the heat in liquefaction, then flows back to heat pipe seat (12) for conducting another gasification of heat absorbing in cycling operation; since the heat absorbing disc (121) and the computer heat generating component (CPU) (60) firmly attach to each other in a wide area, the heat conduction rapidly spreads to the heat sink (20), in addition, the heat sink (20) is disposed in a ventilating area, so the heat and the air rapidly contact and diffuse to achieve the best effect of heat dissipation.

Figure 4:
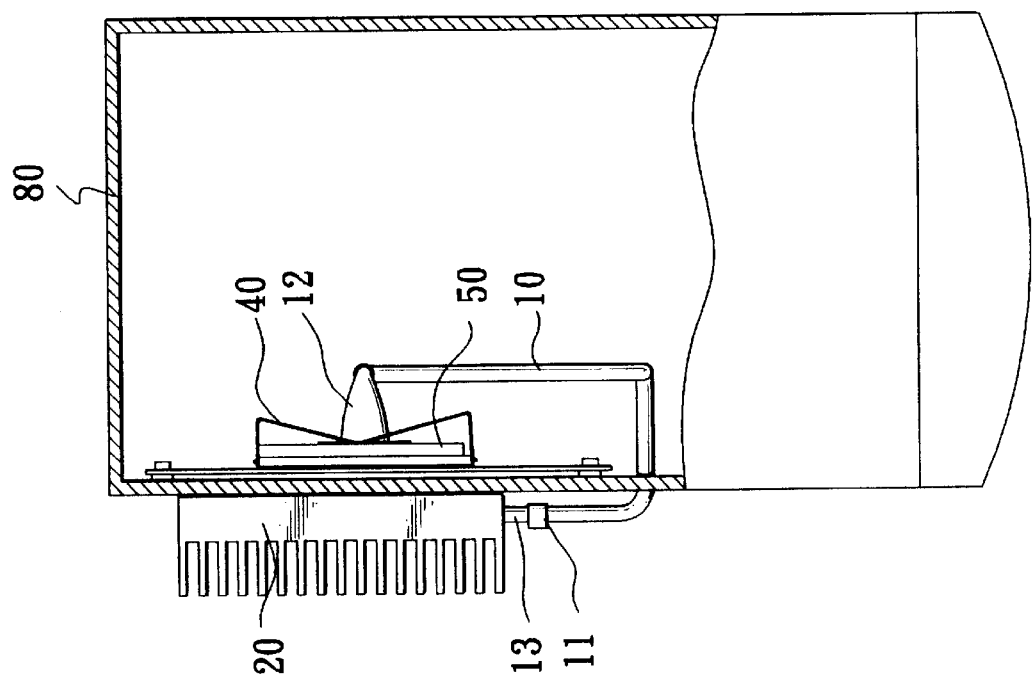
FIG. 4 is a lateral view and schematic drawing of another exemplary embodiment of the present invention.

Referring to FIG. 4, the lateral view and schematic drawing of another exemplary embodiment of the present invention, the said heat sink (21) can be disposed on the outer side of the machine set case of the computer for directly contacting with the air; when distributing the heat, the airflow rapidly diffuses the heat so as to achieve the efficiency of best heat dissipation by eliminating the situation of heat cumulation in operation, failing to lower the temperature of the heat source, causing the hot air inside the computer to burn or damage the parts and further shortening the useful lives of the parts; more particularly, the present invention meet the needs of a plurality of electronic heat generating components; it is only necessary to dispose a plurality of insert holes (21) on the heat sink (20) and insert the heat pipes (13) connecting with various electronic heat generating components into the insert holes (21), that not only increases the space utilization, but also reduces the mounting of the parts so as to further reduce the costs.

It is of course to be understood that the embodiment described herein is merely illustrative of the principles of the invention and that a wide variety of modifications thereto may be effected by persons skilled in the art without departing from the spirit and scope of the invention as set forth in the following claims.

What is claimed is:

1. Apparatus for dissipating heat from an electronic heat generating component including a CPU, comprising a flexible heat pipe disposed between the electronic heat generating component and a heat sink, wherein a middle segment of the heat pipe is a flexible hose with a first end thereof connected with a heat pipe seat and a second end connected to the heat sink by lashing rings to separate a heating portion and a cooling portion; the heat pipe seat is a bent metal tube in a horn shape having a narrow top and a wide, flat bottom portion, a circumference of the bottom portion extends outwardly to form a circular heat absorbing disc for facilitating a firm attachment to the electronic heat generating component and for increasing a contact area therewith of the heat source; and the heat sink is disposed in a ventilating area for direct contact with air.

2. The apparatus according to claim 1 further comprising a fastening rest disposed on the heat absorbing disc, the fastening rest including a plate body with a hollow and circular insert hole accommodating the heat absorbing disc; claw feet disposed in lower aspect of four corner ends thereof and hooked on the CPU.

3. The apparatus according to claim 1 wherein a jointing end of the heat sink has a tube shape.

4. The apparatus according to claim 1 wherein a jointing end of the heat sink has a plate shape.

* * * * *